US011683023B1

(12) United States Patent
Forbes et al.

(10) Patent No.: US 11,683,023 B1
(45) Date of Patent: Jun. 20, 2023

(54) PROGRAMMABLE DELAY DEVICE ENABLING LARGE DELAY IN SMALL PACKAGE

(71) Applicant: National Technology & Engineering Solutions of Sandia, LLC, Albuquerque, NM (US)

(72) Inventors: Travis Forbes, Overland Park, KS (US); Jesse Moody, Cedar Crest, NM (US); Benjamin Thomas Magstadt, Kansas City, MO (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/972,741

(22) Filed: Oct. 25, 2022

Related U.S. Application Data

(60) Provisional application No. 63/296,910, filed on Jan. 6, 2022.

(51) Int. Cl.
  *H03H 11/26* (2006.01)
  *H03K 5/01* (2006.01)
  *H03K 5/00* (2006.01)
(52) U.S. Cl.
  CPC .......... *H03H 11/265* (2013.01); *H03K 5/01* (2013.01); *H03K 2005/00026* (2013.01)
(58) Field of Classification Search
  CPC .......... H03H 11/265; H03K 5/01; H03K 2005/00026

(Continued)

(56) References Cited

U.S. PATENT DOCUMENTS 6,500,120 B1 * 12/2002 Anthony ............ G01S 15/8915
  600/443
6,856,925 B2 * 2/2005 Muhammad ........... H03D 7/125
  455/296

(Continued)

OTHER PUBLICATIONS

Chu, K. D. et al., "A Broadband and Deep-TX Self-Interference Cancellation Technique for Full-Duplex and Frequency-Domain-Duplex Transceiver Applications," 2018 IEEE International Solid-State Circuits Conference, Session 9, Wireless Transceivers and Techniques, 9.7, 3 pages.

(Continued)

*Primary Examiner* — Ryan Jager
(74) *Attorney, Agent, or Firm* — Mark A. Dodd

(57) ABSTRACT

A programmable delay device that provides delays of more than 100 ns over a broad bandwidth is disclosed. The device includes an input stage that employs M sampling switched capacitor elements such that each sampling switched capacitor element samples at a rate of only 1/M of the fundamental sampling rate. The device includes a programmable delay stage with M programmable switched capacitor banks, each programmable switched capacitor bank having N delay switched capacitor storage elements. Thus, the programmable delay stage includes a total of M×N delay switched capacitor storage elements, thereby reducing the sampling rate by a factor of M×N. This reduced sampling rate permits much smaller sampling switches, resulting in reduced leakage current and enabling far longer programmable delay times. Lastly, the device includes an output reconstruction stage that reconstructs a delayed version of the input RF signal by combining signals from the programmable delay stage.

20 Claims, 13 Drawing Sheets

(58) Field of Classification Search
USPC .......................................................... 273/278
See application file for complete search history.

(56) References Cited

U.S. PATENT DOCUMENTS

| | | | | |
|---|---|---|---|---|
| 7,671,658 B2* | 3/2010 | Harada | .................... | H03D 7/14 327/554 |
| 7,965,135 B2* | 6/2011 | Yoshizawa | ........... | H03H 15/023 327/554 |
| 8,164,380 B2* | 4/2012 | Hosokawa | ............. | H03H 15/00 327/554 |
| 8,229,987 B2* | 7/2012 | Hosokawa | ............. | H03D 7/125 708/847 |
| 8,340,617 B2* | 12/2012 | Hosokawa | ............. | H03D 3/007 455/313 |
| 8,385,874 B2* | 2/2013 | Abe | .................... | H03D 7/1441 455/313 |
| 8,433,276 B2* | 4/2013 | Morishita | ............ | H03H 15/023 455/313 |
| 8,570,100 B2* | 10/2013 | Morishita | ............ | H03H 15/023 455/313 |
| 9,093,982 B2* | 7/2015 | Morishita | ............ | H03H 15/023 |
| 9,318,999 B2* | 4/2016 | Morishita | ............ | H03H 19/004 |
| 11,054,509 B2* | 7/2021 | Freeman | ............ | G01S 15/8915 |
| 2003/0035499 A1* | 2/2003 | Staszewski | ............ | H03D 7/125 375/350 |
| 2003/0083033 A1* | 5/2003 | Staszewski | ............ | H03D 7/125 455/313 |
| 2005/0036572 A1* | 2/2005 | Muhammad | ............ | H04L 7/007 375/322 |
| 2005/0131299 A1* | 6/2005 | Robinson | ............ | G01S 15/8927 600/447 |
| 2006/0071707 A1* | 4/2006 | Belveze | ................. | H03H 15/00 327/554 |
| 2007/0275684 A1* | 11/2007 | Harada | .................... | H03D 7/14 455/185.1 |
| 2009/0002066 A1* | 1/2009 | Lee | .................... | H04B 1/1027 327/554 |
| 2009/0270061 A1* | 10/2009 | Hosokawa | ............. | H03D 7/125 455/323 |
| 2010/0109746 A1* | 5/2010 | Hosokawa | ............. | H03H 15/00 327/551 |
| 2011/0176640 A1* | 7/2011 | Morishita | ............ | H03H 19/004 375/318 |
| 2011/0183639 A1* | 7/2011 | Morishita | ............ | H03H 15/023 327/105 |
| 2012/0197130 A1* | 8/2012 | Amemiya | ............ | G10K 11/346 600/459 |
| 2014/0264050 A1* | 9/2014 | Rostaing | ............. | H03H 11/265 250/371 |
| 2016/0173145 A1* | 6/2016 | Forbes | .................... | H03F 3/68 375/219 |
| 2022/0263472 A1* | 8/2022 | Moody | ................. | H03F 1/0222 |

OTHER PUBLICATIONS

Garakoui, S. K. et al., "A 1-2.5GHz Phased-Array IC Based on gm-RC All-Pass Time-Delay Cells," 2012 IEEE International Solid-State Circuits Conference, Session 4, RF Techniques, 4.4, 3 pages.

Li, M. et al., "An 800-ps Origami True-Time-Delay-Based CMOS Receiver Front End for 6.5-9-GHz Phased Arrays," EEE Solid State Circuits Letters (2020) 3:382-385.

Mak, P.-I. et al., "A 0.46-mm2 4-dB NF Unified Receiver Front-End for Full-Band Mobile TV in 65-nm CMOS," IEEE Journal of Solid-State Circuits (2011) 46(9):1970-1984.

Mondal, I. et al., "A 2-GHz Bandwidth, 0.25-1.7 ns True-Time-Delay Element Using a Variable-Order All-Pass Filter Architecture in 0.13 um CMOS," IEEE Journal of Solid-State Circuits (2017) 52(8):2180-2193.

Nagulu, A. et al., "Full-Duplez Receiver with Wideband Multi-Domain FIR Cancellation Based on Stacked-Capacitor, N-Path Switched-Capacitor Delay Lines Achieving >54dB SIC Across 80MHz BW and >15dBm TX Power-Handling," 2021 IEEE International Solid-State Circuits Conference, Session 6, High-Performance Receivers and Transmitters for Sub-6GHZ Radios, 6.6, 3 pages.

Nagulu, A. et al., "A Full-Duplex Receiver Leveraging Multiphase Switched-Capacitor-Delay Based Multi-Domain FIR Filter Cancelers," 2020 IEEE Radio Frequency Integrated Circuits Symposium, pp. 43-46.

* cited by examiner

PROGRAMMABLE DELAY DEVICE ENABLING LARGE DELAY IN SMALL PACKAGE

RELATED APPLICATIONS

This application claims priority to U.S. Provisional Application No. 63/296,910, filed on Jan. 6, 2022, and entitled PROGRAMMABLE DELAY DEVICE ENABLING LARGE DELAY IN SMALL PACKAGE, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a delay device, and in particular, to a programmable delay device having three stages, thereby allowing large delays for radio frequency (RF) applications.

BACKGROUND

Full-duplex (FD) RF wireless has seen significant interest to increase spectral efficiency as the transmitter (TX) and receiver (RX) operate at the same frequency and time. Large (>100 dB) cancellation of the TX signal arriving in-band at the RX input through limited TX-RX isolation and radar-like reflections from objects is required for deployment. Recent efforts utilized finite impulse response (FIR) time-domain equalizer-based self-interference cancelation (SIC) techniques, which employ RF delay elements and gain weighting for SIC. Greater than 100 ns of delay is desired to cover a full FD delay spread, which could counter reflections from objects within 50 feet. Prior art devices have demonstrated RF delays of less than 8 ns, corresponding to reflections from objects within 4 feet, resulting in TX reflections from nearby objects that saturate the RX before additional cancellation in the baseband can be applied. For a TX operating at 900 MHz with a transmission power of 27 dBm, objects at 4 ft, 20 ft, and 50 ft will produce reflected powers of >1 dBm, >−27 dBm, and >−42 dBm, respectively. For objects at distances of less than 50 ft, the high reflected power levels would saturate the RF front end before additional cancellation could be applied further along in the baseband chain. For this reason, FD wireless systems need hundreds of ns of delay for sufficient RF cancellation. Furthermore, this example is for a single reflecting object, whereas a real environment will include many reflecting objects.

The need for appreciable RF delays is not limited to FD RF wireless applications. For example, programmable delays of greater than 100 ns may also be employed with radar testers, analog correlators and FIR filters, and digital RF memories.

To date, >100 ns of RF delay has been achieved in acoustic delay lines. These acoustic delay lines, however, have a narrow bandwidth and do not provide a programmable delay. Thus, acoustic delay lines are typically limited to applications such as large radar and communication systems.

Alternatives to acoustic delay lines include $g_m$-C all-pass filters and switched-capacitor circuits. While $g_m$-C all-pass filters can achieve more than a factor of twenty increase in area efficiency (ns of delay per square mm of circuitry) compared to delay lines, they are limited to <2 ns delays. See S. Garakoui et al., "A 1-to-2.5 GHz Phased-Array IC Based on $g_m$-RC All-Pass Time-Delay Cells," IEEE International Solid-State Circuits Conference, pp. 80-82 (2012) and I. Mondal and N. Krishnapura, "A 2-GHz Bandwidth, 0.25-1.7 ns True-Time-Delay Element Using a Variable-Order All-Pass Filter Architecture in 0.13 µm CMOS," IEEE Journal of Solid-State Circuits, vol. 52, no. 8, pp. 2180-2193 (2017), the contents of each of which are incorporated herein by reference. Switched-capacitor circuits have achieved an additional factor of five increase in area efficiency, but are limited to <8 ns RF delays. This delay duration is limited by the complexity of the required RF clock generation, capacitive loading with increased number of switch capacitor cells, and sample leakage through large sampling switches. See A. Nagulu et al., "Full-Duplex Receiver with Wideband Multi-Domain FIR Cancellation Based on Stacked-Capacitor N-Path Switched-Capacitor Delay Lines Achieving >54 dB SIC Across 80 MHz BW and >15 dBm TX Power-Handling," IEEE International Solid-State Circuits Conference, pp. 100-102 (2021), the contents of which are incorporated herein by reference.

The need thus exists for a delay device that can provide programmable delay of more than 100 ns over a broad bandwidth.

SUMMARY

One aspect of the present invention relates to a programmable delay device that provides delays of more than 100 ns over a broad bandwidth (>500 MHz). To accomplish this, the programmable delay device includes an input stage that employs M sampling switched capacitor storage elements such that while the input RF signal is sampled at a frequency $F_S$, each individual sampling switched capacitor storage element samples at a rate of only $F_S/M$. The programmable device further includes a programmable delay stage with M programmable switched capacitor banks, each programmable switched capacitor bank having N delay switched capacitor storage elements. Thus, the programmable delay stage includes a total of M×N delay switched capacitor storage elements, thereby effecting an M×N reduction in the sampling rate at the individual delay switched capacitor storage element level. This reduced sampling rate permits the use of much smaller sampling switches, resulting in reduced leakage current and the ability to implement far longer programmable delay times. Lastly, the programmable delay device includes an output reconstruction stage that reconstructs a programmably delayed version of the input RF signal by reconstructing signals from the programmable delay stage. The programmable delay device optionally includes buffers in each stage to further reduce losses (or provide gain) at the expense of added layout space and consumed power.

In at least one embodiment of the invention, a programmable delay device comprises an input sampling stage including M sampling switched capacitor storage elements (the M sampling switched capacitor storage elements sequentially sampling and holding a corresponding portion of an input RF signal, the thus sampled and held portions of the input RF signal being input sampled signals), a programmable delay stage including M programmable switched capacitor banks (each programmable switched capacitor bank including N delay switched capacitor storage elements, each delay switched capacitor storage element sampling and holding a corresponding time interleaved portion of a corresponding input sampled signal, the thus sampled and held signals being delay sampled switched signals, each delay switch capacitor storage element coupled to a corresponding delay output switch) and an enable timing circuit adapted to receive a desired delay value (the enable timing circuit including a digital counter, the digital counter counting to the desired delay value, upon reaching the desired delay value the enable timing circuit enables a corresponding delay output switch), and an output reconstruction stage including M output reconstruction switches (each output reconstruction switch coupled to a corresponding delay output switch, each output reconstruction switch outputting a corresponding time interleaved delay sampled switched signal, the thus output signals being output reconstruction signals, the output reconstruction stage outputting the output reconstruction signals in a sequential manner thereby generating a reconstructed output RF signal).

In various embodiments, M is equal to or greater than 4; each sampling switched capacitor storage element includes an input sampling capacitor holding a corresponding input sampled signal and an input sampling switch sequentially coupling the input RF signal to the input sampling capacitor; N is equal to or greater than 2; each delay switched capacitor storage element includes a switched bank sampling capacitor holding a corresponding delay sampled switched signal and an input switched bank switch coupling a corresponding input sampled signal to the switched bank sampling capacitor in a time interleaved manner; the input sampling stage further includes M buffers (each buffer coupling a corresponding sampling switched capacitor storage element to a corresponding programmable switched capacitor bank); the programmable delay stage further includes M×N delay buffers (each delay buffer coupling a corresponding delay switched capacitor storage element to a corresponding delay output switch); and the output reconstruction stage further includes M output buffers (each output buffer coupling a corresponding delay output switch to a corresponding output reconstruction switch).

In other embodiments, the programmable delay device further comprises an input divide-by-M clock receiving a sampling clock signal, dividing the sampling clock signal by M, and outputting M thus generated input divide-by-M clock signals, and M input divide-by-N clocks (each input divide-by-N clock receiving a corresponding input divide-by-M clock signal, dividing the corresponding input divide-by-M clock signal by N, and outputting N thus generated input divide-by-N clock signals), each sampling switched capacitor storage element being operated by a corresponding input divide-by-M clock signal, and each delay switched capacitor storage element being operated by a corresponding input divide-by-N clock signal; the programmable delay device further comprises a divide-by-P clock receiving the sampling clock signal, dividing the sampling clock signal by P, and outputting a thus generated divide-by-P clock signal to the input divide-by-M clock as the sampling clock signal; and the programmable delay device further comprises an input pulse extend clock receiving the M input divide-by-M clock signals, lengthening a pulse length of each input divide-by-M clock signal, and outputting M thus generated input pulse extended clock signals to the M input divide-by-N clocks as corresponding input divide-by-M clock signals.

In still other embodiments, the programmable delay device further comprises M output divide-by-N clocks (each output divide-by-N clock receiving a corresponding input divide-by-M clock signal, dividing the corresponding input divide-by-M clock signal by N, and outputting N thus generated output divide-by-N clock signals), each output reconstruction switch being operated by a corresponding input divide-by-M clock signal and each delay output switch being operated by a corresponding output divide-by-N clock signal; the programmable delay device further comprises an output divide-by-M clock receiving the sampling clock signal, dividing the sampling clock signal by M, and outputting M thus generated output divide-by-M clock signals, M output divide-by-N clocks (each output divide-by-N clock receiving a corresponding output pulse extended clock signal, dividing the corresponding output pulse extended clock signal by N, and outputting N thus generated output divide-by-N clock signals), each output reconstruction switch being operated by a corresponding output divide-by-M clock signal and each delay output switch being operated by a corresponding output divide-by-N clock signal; and the programmable delay device further comprises an output pulse extend clock receiving the M output divide-by-M clock signals, lengthening a pulse length of each output divide-by-M clock signal, and outputting M thus generated output pulse extended clock signals to the M output divide-by-N clocks as corresponding output divide-by-M clock signals.

In yet other embodiments, the programmable delay device further comprises a serial programming interface receiving the desired delay value from an external programming source and outputting the desired delay value to the digital counter; at least a portion of the programmable delay device is implemented with CMOS circuitry; at least a portion of the programmable delay device is implemented in either a single-ended configuration or a differential configuration; the programmable delay device has an area efficiency of greater than 100 ns/mm$^2$; the programmable delay device has a maximum delay of greater than 100 ns; and the programmable delay device has a 3 dB bandwidth of greater than 500 MHz.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 3A illustrates a block diagram, while

DETAILED DESCRIPTION

Figure 1:
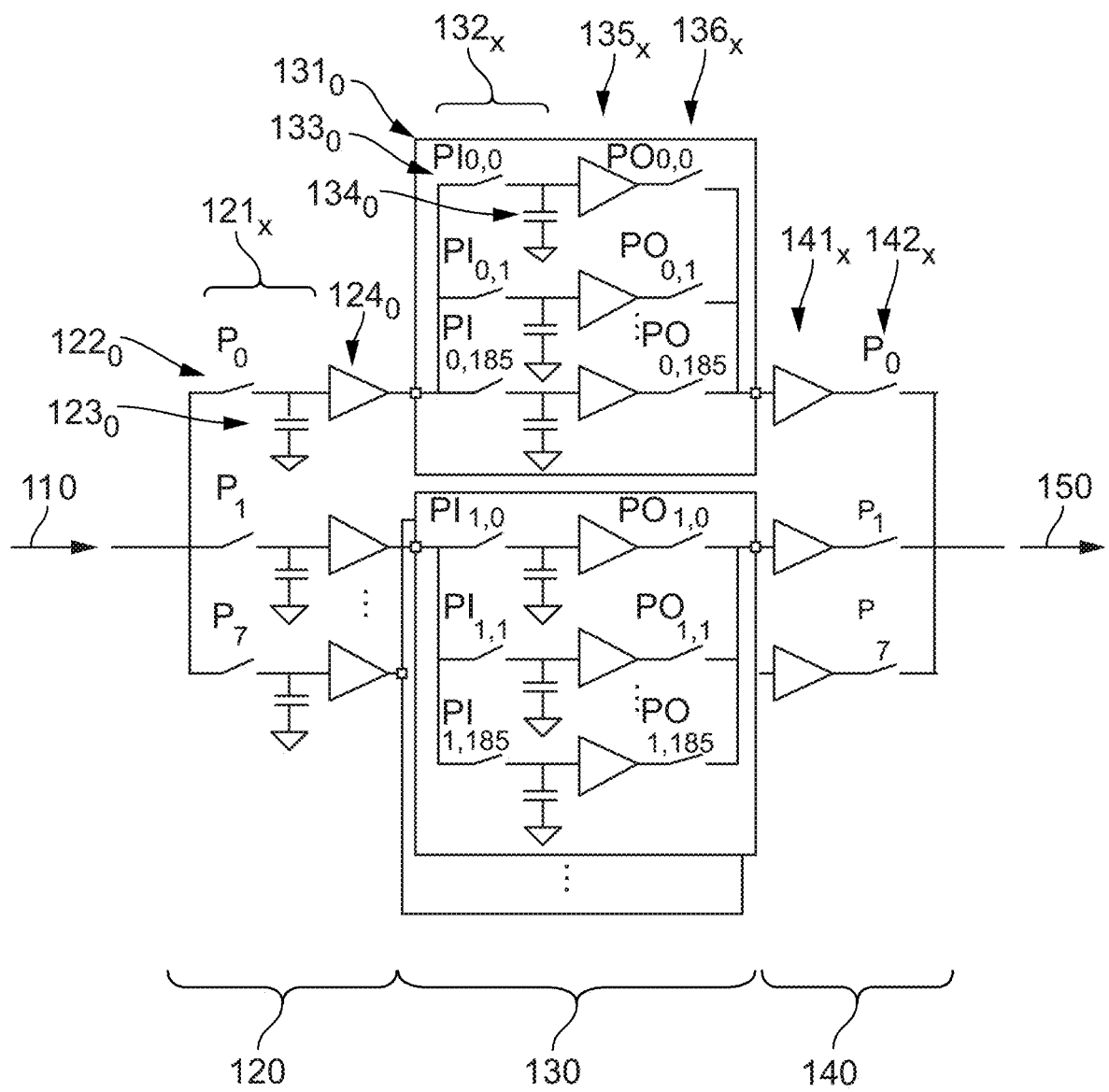
FIG. 1 illustrates a single-ended programmable delay device in accordance with one or more embodiments of the present invention.

FIG. 1 illustrates a single-ended configuration programmable delay device 100 in accordance with one or more embodiments employing a time-interleaved multistage switched-capacitor (TIMS-SC) architecture. The programmable delay device is preferably implemented in a differential manner as described below with reference to FIG. 3. The programmable delay device 100 includes an input sampling stage 120 of eight sampling switched capacitor storage elements $121_0$-$121_7$. Each sampling switched capacitor storage element $121_0$-$121_7$ includes a corresponding input sampling switch $122_0$-$122_7$ and corresponding input sampling capacitor $123_0$-$123_7$. The eight sampling switched capacitor storage elements $121_0$-$121_7$ are sequentially coupled to an input RF signal 110 via corresponding input sampling switches $122_0$-$122_7$, thereby sequentially sampling the input RF signal 110. For example, sampling switched capacitor storage element $121_0$ temporarily stores samples 1, 9, etc., while sampling switched capacitor storage element $121_1$ temporarily stores samples 2, 10, etc. This sampling process will be described below with respect to FIG. 2. The signals held by the eight sampling switched capacitor storage elements $121_0$-$121_7$ are termed input sampled signals. Each of the eight sampling switched capacitor storage elements $121_0$-$121_7$ is coupled to a corresponding programmable switched capacitor bank $131_0$-$131_7$ in a programmable delay stage 130 via a corresponding buffer $124_0$-$124_7$.

In this illustrated embodiment, the input sampling stage 120 is an 8-phase switched capacitor network sampling at the full sampling rate of $F_S$. While the input sampling stage 120 illustrated in FIG. 1 has eight sampling switched capacitor storage elements $121_0$-$121_7$, i.e., is an 8-phase switched capacitor network, other embodiments may have an input sampling stage with M sampling switched capacitor storage elements, resulting in an M-phase switched capacitor network. In these embodiments, M may be smaller or larger than 8, though M is preferable 4 or greater. Further, in this embodiment with eight programmable switched capacitor banks $131_0$-$131_7$, each programmable switched capacitor bank $131_0$-$131_7$ has a sampling rate of $F_S/8$.

As illustrated in FIG. 1, each programmable switched capacitor bank $131_0$-$131_7$ includes 186 delay switched capacitor storage elements $132_0$-$132_{185}$. Each delay switched capacitor storage element $132_0$-$132_{185}$ includes a corresponding input switched bank switch $133_0$-$133_{185}$ and corresponding switched bank sampling capacitor $134_0$-$134_{185}$. The 186 delay switched capacitor storage elements $132_0$-$132_{185}$ are coupled to a corresponding buffer $124_0$-$124_7$ via corresponding input switched bank switches $133_0$-$133_{185}$ in a time interleaved manner, thereby sampling a corresponding input sampled signal. Thus, the programmable delay stage 130 includes a total of 8×186=1,488 delay switched capacitor storage elements, i.e., 1,488 input switched bank switches and 1,488 switched bank sampling capacitors. The signals held by the 1,488 delay switched capacitor storage elements are termed delay sampled switched signals. Each delay switched capacitor storage element $132_0$-$132_{185}$ is coupled to a corresponding delay buffer $135_0$-$135_{185}$ and delay output switch $136_0$-$136_{185}$.

While the programmable delay stage 130 illustrated in FIG. 1 has eight programmable switched capacitor banks $131_0$-$131_7$, other embodiments may have a programmable delay stage with M programmable switched capacitor banks. In these embodiments, M may be smaller or larger than 8, though the number of programmable switched capacitor banks in the programmable delay stage must equal the number of sampling switched capacitor storage elements in the input sampling stage. Further, while each programmable switched capacitor bank $131_0$-$131_7$ illustrated in FIG. 1 includes 186 delay switched capacitor storage elements $132_0$-$132_{185}$, other embodiments may have programmable switched capacitor banks with N delay switched capacitor storage elements. In these embodiments, N may be smaller or larger than 186, with a larger value for N resulting in a greater range of programmable delay times and a larger physical device. N is preferably 64 or greater.

Each of the eight programmable switched capacitor banks $131_0$-$131_7$ is coupled to a corresponding output reconstruction switch $142_0$-$142_7$ via a corresponding optional output buffer $141_0$-$141_7$ in an output reconstruction stage 140. The signals output by the eight optional output buffer $141_0$-$141_7$ are termed output reconstruction signals. In this embodiment, the output reconstruction stage 140 is an 8-phase switching network operating at the full sampling rate of $F_S$. The output reconstruction stage 140, based on the sequential switching of the output reconstruction switches $142_0$-$142_7$, outputs a reconstructed delayed output RF signal 150 that corresponds to a programmed time delayed version of the input RF signal 110.

The programmable delay device 100 illustrated in FIG. 1 includes a first set of eight buffers $123_0$-$123_7$ between the input sampling stage 120 and the programmable delay stage 130, along with a second set of eight optional output buffers $141_0$-$141_7$ between the programmable delay stage 130 and the output reconstruction stage 140. The programmable delay device 100 further includes delay buffers $135_0$-$135_{185}$ in each of the eight programmable switched capacitor banks $131_0$-$131_7$. In other embodiments, these delay buffers $135_0$-$135_{185}$ may be deleted leading to a passive implementation, thereby creating a tradeoff between power consumption, loss of gain, area, and area efficiency.

Figure 2:
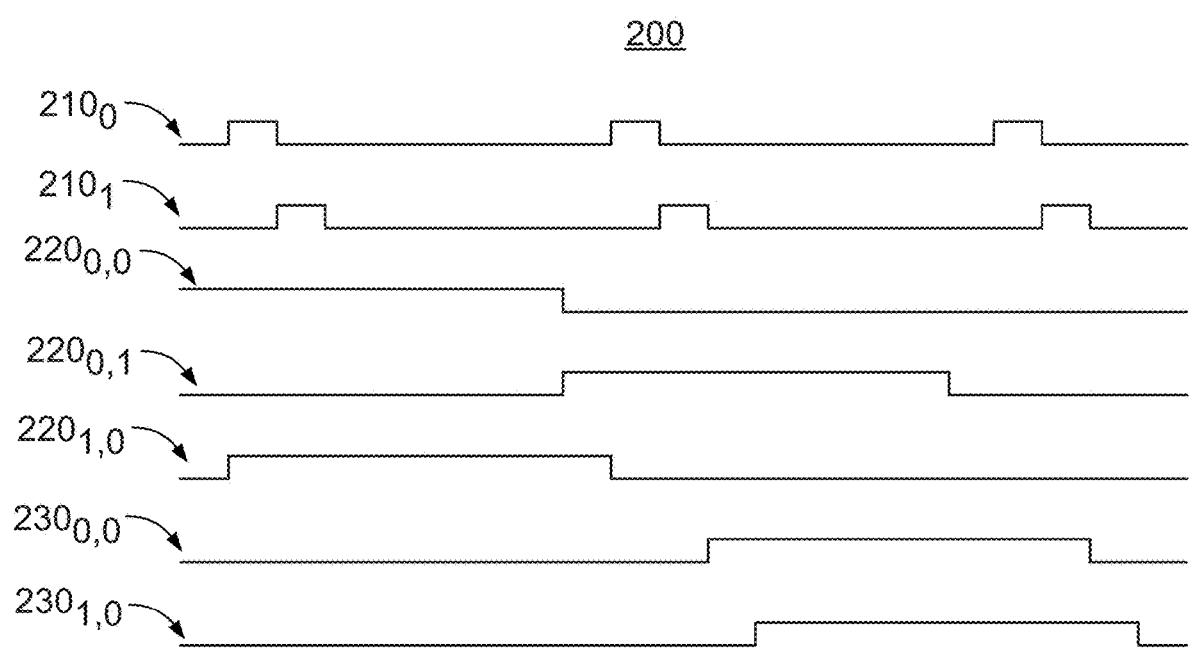
FIG. 2 illustrates a timing diagram for a programmable delay device in accordance with one or more embodiments of the present invention.

FIG. 2 illustrates a timing diagram 200 for the programmable delay device 100 illustrated in FIG. 1. The first two lines $210_0$, $210_1$ of the timing diagram 200 correspond to the sampling of the input signal 110 by the first two sampling switched capacitor storage elements $121_0$, $121_1$ via input sampling switches $122_0$, $122_1$, i.e., clocks $P_0$ and $P_1$. The next three lines $220_{0,0}$, $220_{0,1}$, $220_{1,0}$ correspond to the sampling of the signals output by the first two sampling switched capacitor storage elements $121_0$, $121_1$ by the first two delay switched capacitor storage elements $132_0$, $132_1$ of the first programmable switched capacitor bank $131_0$, i.e., clocks $PI_{0,0}$ and $PI_{0,1}$, and the first delay switched capacitor storage element $132_0$ of the second programmable switched capacitor bank $131_1$, i.e., clock $P_{1,0}$, respectively. The last two lines $230_{0,0}$, $230_{1,0}$ of the timing diagram 200 correspond to the output timing of the first delay switched capacitor storage element $132_0$ of the first programmable switched capacitor bank $131_0$ and the first delay switched capacitor storage element $132_0$ of the second programmable switched capacitor bank $131_1$, i.e., clocks $P0_{0,0}$ and $P0_{1,0}$, respectively.

As reflected by the first two lines $210_0$, $210_1$, the input signal 110 is sampled at a sampling rate of $F_S$ with a period of $T=1/F_S$, with the first two sampling switched capacitor storage elements $121_0$, $121_1$ sampling the first $118^{th}$ T and second $118^{th}$ T, respectively. The first line $210_0$ shows the sampling of the input signal 110 that generates input sampled signals 1, 9, 17, etc., while the second line $210_1$ shows the sampling of the input signal 110 that generates input sampled signals 2, 10, 18, etc. The third line $220_{0,0}$ shows the storage of input sampled signal 1 by the first delay switched capacitor storage element $132_0$ in the first programmable switched capacitor bank $131_0$ as delay sampled switched signal 1. The fourth line $220_{0,1}$ shows the storage of input sampled signal 9 by the second delay switched capacitor storage element $132_1$ in the first programmable switched capacitor bank $131_0$ as delay sampled switched signal 9. The fifth line $220_{1,0}$ shows the storage of input sampled signal 2 by the first delay switched capacitor storage element $132o$ in the second programmable switched capacitor bank $131_1$ as delay sampled switched signal 2. The sixth line $230_{0,0}$ shows the passing of delay sampled switched signal 1 stored by the first delay switched capacitor storage element $132_0$ in the first programmable switched capacitor bank $131_0$ to the output reconstruction switch $142_0$ via the output buffer $141_0$ as output reconstruction signal 1. The seventh line $230_{1,0}$ shows the passing of delay sampled switched signal 2 stored by the first delay switched capacitor storage element $132_0$ in the second programmable switched capacitor bank $131_1$ to the output reconstruction switch $142_1$ via the output buffer $141_1$ as output reconstruction signal 2.

While the settling time T is $1/F_S$ in the input sampling stage 120, settling time expansion is created in the programmable delay stage 130 by allowing sample transfer from the input sampling stage 120 to the programmable delay stage 130 to continue during the input sampling stage 120 hold time. With the expanded sample time, the sampler bandwidth required in the programmable delay stage 130 is greatly reduced. This allows the use of much smaller input switched bank switches $133_0$-$133_{185}$ in the delay switched capacitor storage elements $132_0$-$132_{185}$ of the programmable delay stage 130, which in turn enables a large reduction in OFF state sample leakage. This leakage reduction enables a corresponding increase in the maximum achievable hold time, which is key to achieving more than 100 ns of delay. (The programmable delay device 100 illustrated in FIG. 1 achieved a maximum delay of approximately 450 ns at a sampling frequency $F_S$ of 3.3 GHz.)

To reduce timing skew sensitivity, the programmable delay stage 130 input clock signal $PI_{x,y}$ transitions prior to the input sampling stage 120 input sample clock signal $P_x$, where x corresponds to the path in the input sampling stage 120 (i.e., it has a value from 0 to 7) and y corresponds to the path in the programmable delay stage 130 (i.e., it has a value from 0 to 185). Thus, the programmable delay stage 130 input is static during clock transitions (e.g., $PI_{1,0}$ before $P_1$). After the programmed delay, a programmable delay stage 130 output clock signal $PO_{x,y}$ initiates the transfer of the delay sampled switched signal to the input of the corresponding output buffer $141_0$-$141_7$, again time expanded. The output buffers $141_0$-$141_7$ output the delay sampled switched signals employing the same 8-phase clock timing as the input sampling stage 120 ($P_x$) as corresponding output reconstruction signals. Timing skew is again mitigated by transitioning the programmable delay stage 130 output clock signal $PO_{x,y}$ after the output reconstruction stage 140 output clock signal P. The input and output clocks in the programmable delay stage 130 are generated by two separate, but synchronous, divide-by-186 clocks, as will be described below with reference to FIG. 3. The delay is programmed by delaying the enable timing (described below with reference to FIG. 3) of the programmable delay stage 130 output clock signal $PO_{x,0}$ relative to the associated input clock signal $PI_{x,0}$. For the programmable delay device 100 illustrated in FIG. 1, the delay can be programmed over a range from $8/F_s$ to $1480/F_s$ (in $8/F_s$ increments) and scales with the sample frequency $F_S$.

Figure 3A:
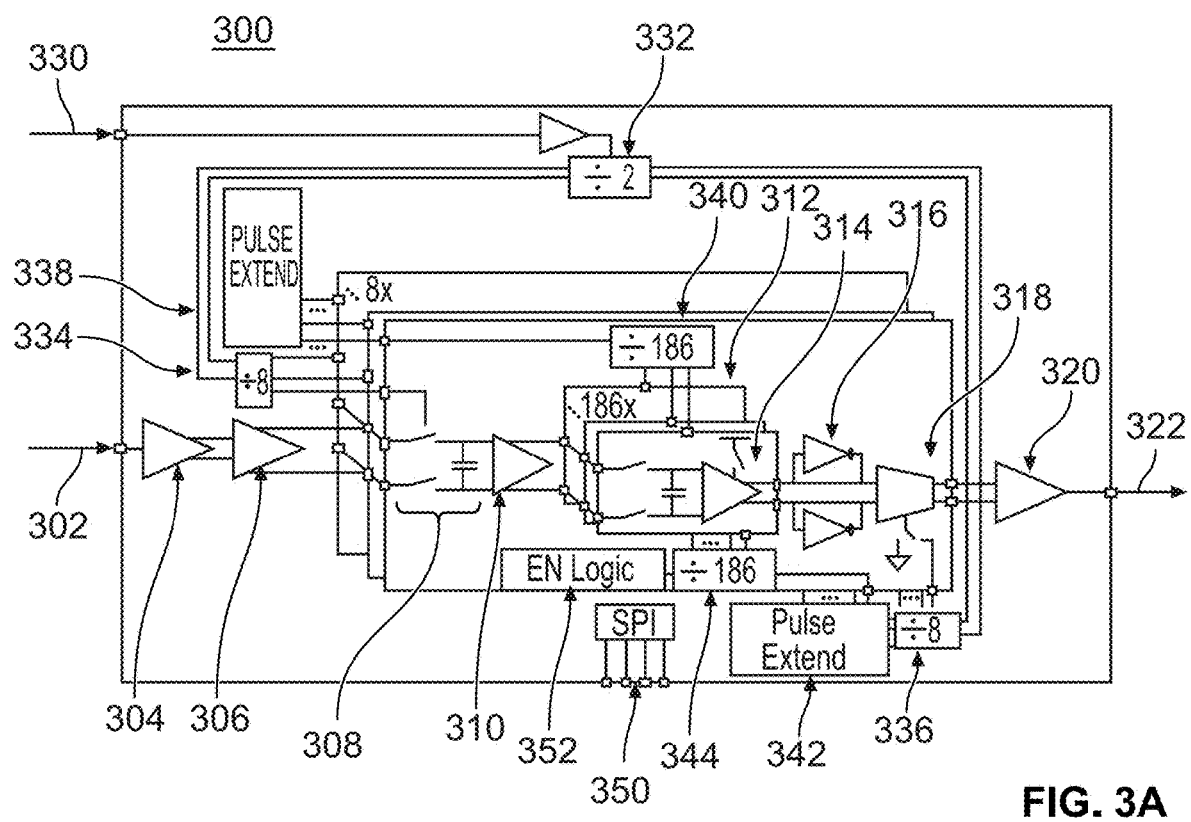
Figure 3B:
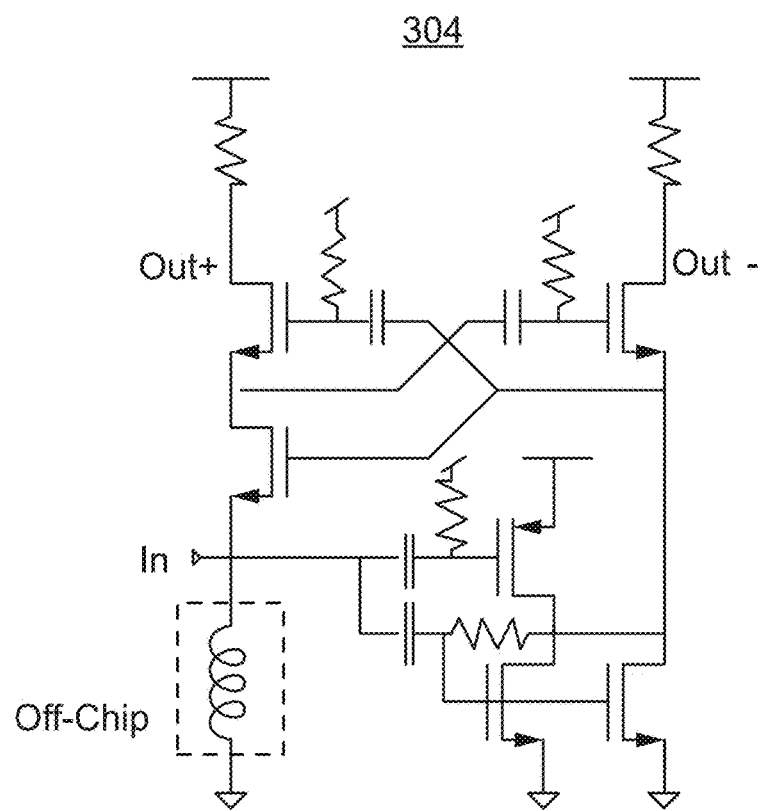
FIGS. 3B-3E illustrate corresponding circuit diagrams, for a differential embodiment of a programmable delay device in accordance with one or more embodiments of the present invention.
Figure 3C:
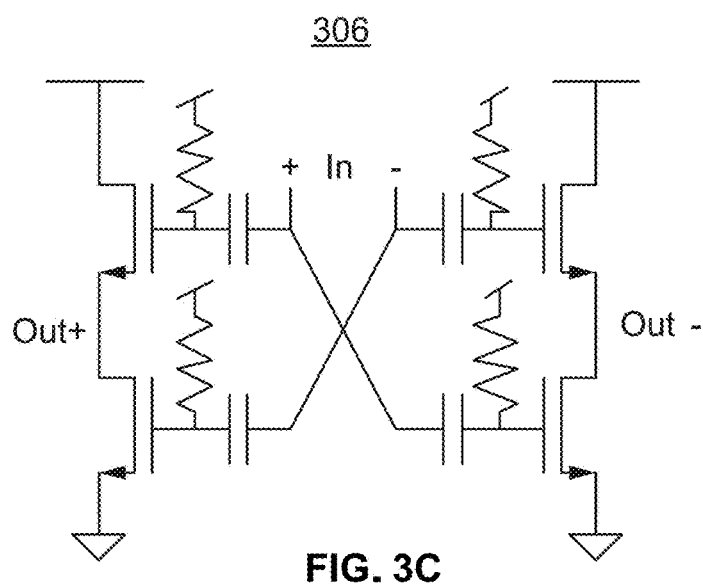
Figure 3D:
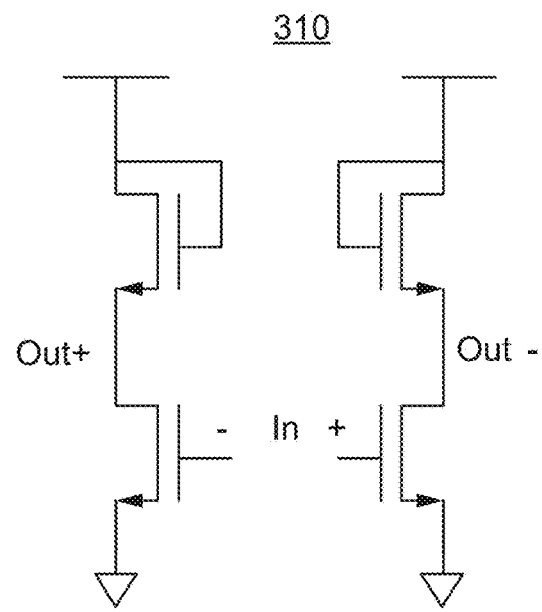
Figure 3E:
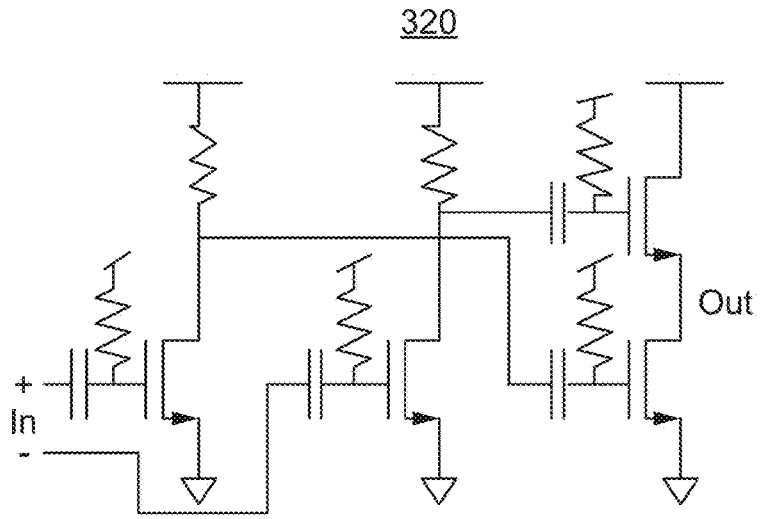

FIG. 3A illustrates a block diagram while FIGS. 3B-3E illustrate corresponding exemplary circuit diagrams for a differential configuration embodiment of a programmable delay device 300 in accordance with one or more embodiments. The programmable delay device 300 may, for example, be formed of CMOS circuitry on a single Si substrate, though other embodiments may, for example, employ circuitry formed of other IV, III-V, or II-VI semiconductor materials. An optional inductorless low noise amplifier (LNA) 304 receives an input RF signal 302 and provides both gain and differential conversion with NMOS bias sharing (see FIG. 3B) to reduce AC coupling capacitors for area savings. An optional device input buffer 306 provides isolation between the output of the LNA 304 and sampling switched capacitor storage elements 308 of the input sampling stage, and employs a push-pull output stage (see FIG. 3C). Each sampling switched capacitor storage element 308 employs a differential capacitor (see FIG. 3D), having, for example, a capacitance of 250 fF, for small area and sampling noise. The differential capacitors store corresponding input sampled signals. The optional buffers 310 between the sampling switched capacitor storage elements 308 and the 186 delay switched capacitor storage elements 312 per programmable switched capacitor bank each employs an NMOS common-source with diode-connected load for unity gain matching between the 8 paths. All the buffers 310 are preferably closely placed in the layout to limit gain mismatch induced signal distortion. The 186 delay switched capacitor storage elements 312 per programmable switched capacitor bank each employs a differential capacitor for storing corresponding delay sampled switched signals.

The optional delay buffers 314 of the programmable switched capacitor banks each employs a dynamic inverter clocked at both VSS and VDD by $PO_{x,y}$, where one of the 186 delay buffers 314 in each path are enabled at a time and all 186 delay buffers 314 share an optional self-biased inverter load 316 for common-mode stability in each of the 8 delay paths. The optional output buffers 318, which incorporate the non-optional output reconstruction switches, are preferably closely placed in the layout for unity gain matching and employ dynamic common-source amplifiers with a shared resistive load. The output reconstruction switches 318 output corresponding output reconstruction signals. An optional device output buffer 320, coupled to the output reconstruction switches 318 provides balun and matching operation and employs a common-source amplifier and push-pull output stage (see FIG. 3E) that outputs a reconstructed delayed output RF signal 322.

Clocking is provided from an input clock 330 at a frequency $F_S$ through a divide-by-2 ($F_{CLK}=2F_S$) clock 332. While the programmable delay device 300 illustrated in FIG. 3A includes a divide-by-2 clock 332, other embodiments may not include any divide-by clock at this point in the clock tree, or may include a divide-by-P clock as desired. An input divide-by 8 clock 334 generates the input sample clock signal $P_x$ and an output divide-by-8 clock 336 generates the output reconstruction clock signal $P_x$, the output reconstruction clock signal $P_x$ being synchronous with the input sample clock signal $P_x$ for low timing skew at the input sampling stage (sampling switched capacitor storage elements 308) and the output reconstruction stage (output reconstruction switches 318) based on the clock signal from the divide-by-2 clock 332. In the more general case, the input divide-by-8 clock 334 and the output divide-by-8 clock 336 would both be divide-by-M clocks. The input sample clock signal $P_x$ from the input divide-by-8 clock 334 is pulse extended to a 50% duty cycle by an input pulse extend clock 338. The input pulse extend clock 338 drives input divide-by-186 clocks 340, which generate the input clock signals $PI_{x,y}$, and which are placed inside each programmable switched capacitor bank area for standard logic implementation compatibility. The output reconstruction clock signal $P_x$ from the output divide-by-8 clock 336 is pulse extended to a 50% duty cycle by an output pulse extend clock 342. The output pulse extend clock 342 drives output divide-by-186 clocks 344, which generate output clock signals $PO_{x,y}$, and which are placed inside each programmable switched capacitor bank area for standard logic implementation compatibility. In the more general case, the input divide-by-186 clocks 340 and the output divide-by-186 clocks 344 would be divide-by-N clocks. While the programmable delay device 300 illustrated in FIG. 3A includes an input pulse extend clock 338 and an output pulse extend clock 342, other embodiments may not include one or both pulse extend clocks 338, 342, though this may require custom logic circuitry. While the programmable delay device 300 illustrated in FIG. 3A includes both an input divide-by-8 clock 334 and an output divide-by-8 clock 336, other embodiments may employ a single divide-by-8 clock (or more generally a divide-by-M clock), though this may result in clock timing skew issues.

The programmable delay operates as follows. The desired delay value Z (between 1 and 185 in the illustrated embodiment), corresponding to delays of $8/F_s$ to $1480/F_s$ in $8/F_s$ increments, is entered using a serial programming interface 350 by an external programming source. The serial programming interface 350 outputs the desired delay value Z, which generates a delay of $Z*8/F_s$, to a digital counter in the enable timing circuit 352. The digital counter is enabled at the same time as the input divide-by-186 clocks 340, which generate the input clock signals $PI_{x,y}$. The digital counter counts up to the programmed delay value Z. Once the digital counter reaches Z, the output divide-by-186 clocks 344, which generate output clock signals $PO_{x,y}$, are enabled, thereby causing the first sample to transfer to the corresponding output reconstruction switch 318. The output clock signals $PO_{x,y}$ continue to cause the transfer of samples to the output reconstruction switches 318 indefinitely and are delayed relative to the input clock signals $PI_{x,y}$ by the desired delay $Z*8/F_s$.

Figure 4:
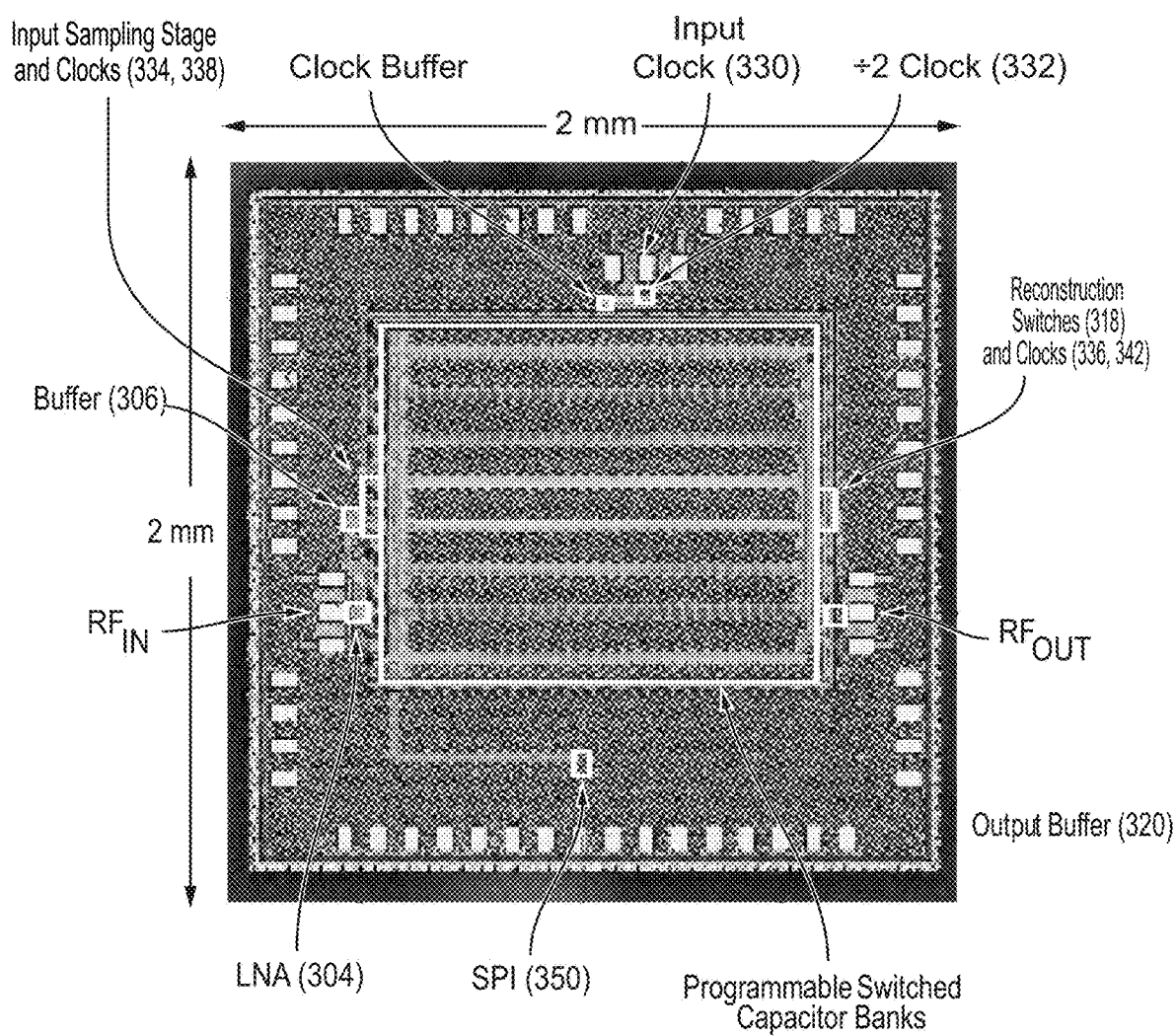
FIG. 4 is a photomicrograph of a programmable delay device in accordance with one or more embodiments of the present invention.
Figure 5:
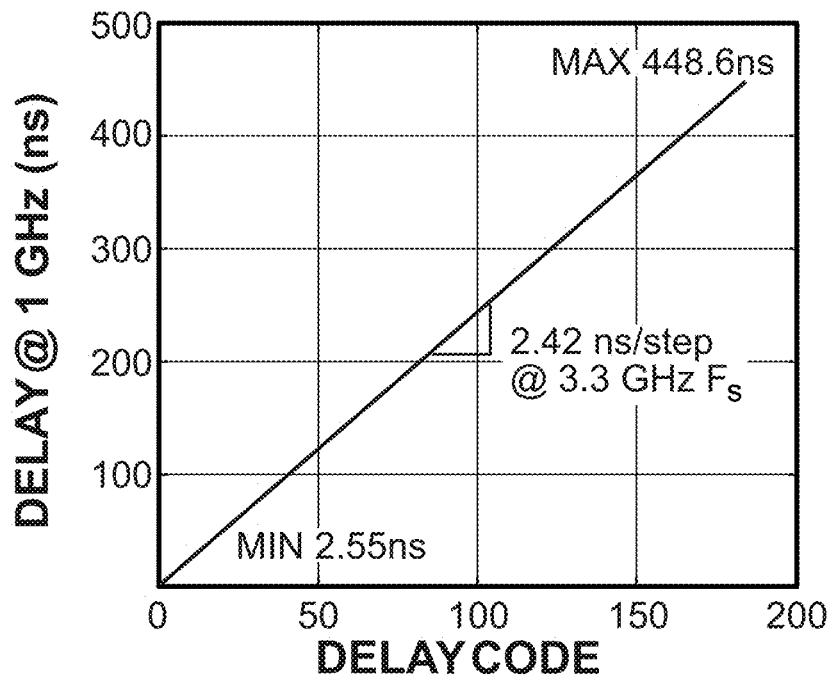
FIG. 5 illustrates the measured delay performance across all delay settings for a programmable delay device in accordance with one or more embodiments of the present invention.
Figure 6:
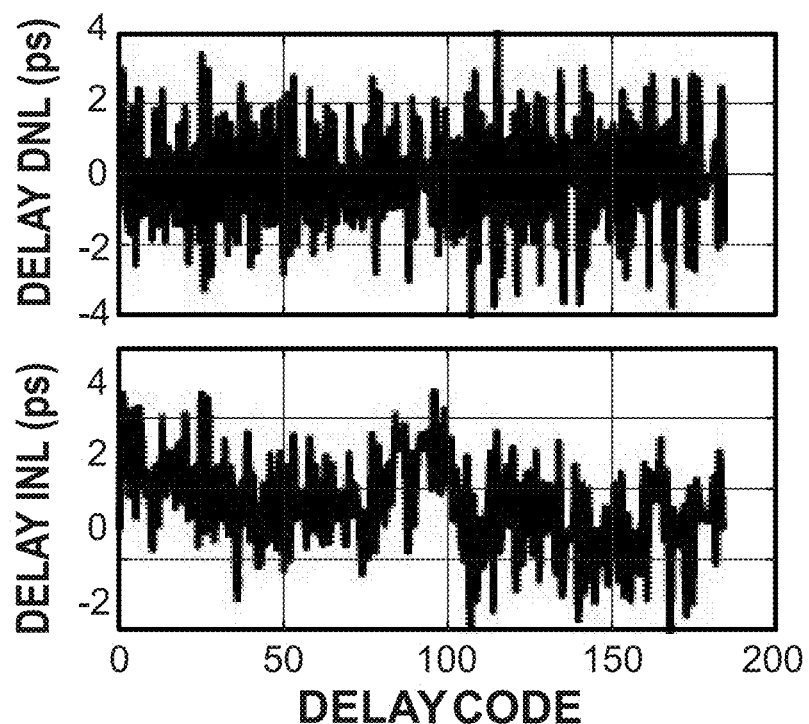
FIG. 6 illustrates the measured differential nonlinearity and integral nonlinearity across all delay settings for a programmable delay device in accordance with one or more embodiments of the present invention.
Figure 7A:
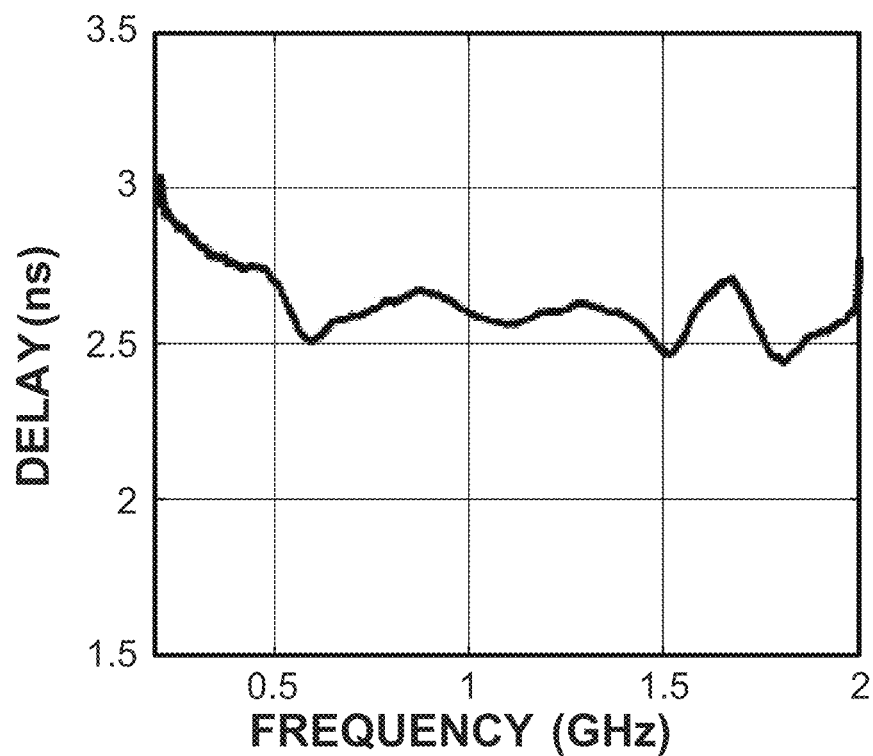
FIGS. 7A and 7B illustrate the measured delay response at minimum and maximum delay settings, respectively, across a 0.2-to-2 GHz input frequency range for a programmable delay device in accordance with one or more embodiments of the present invention.
Figure 7B:
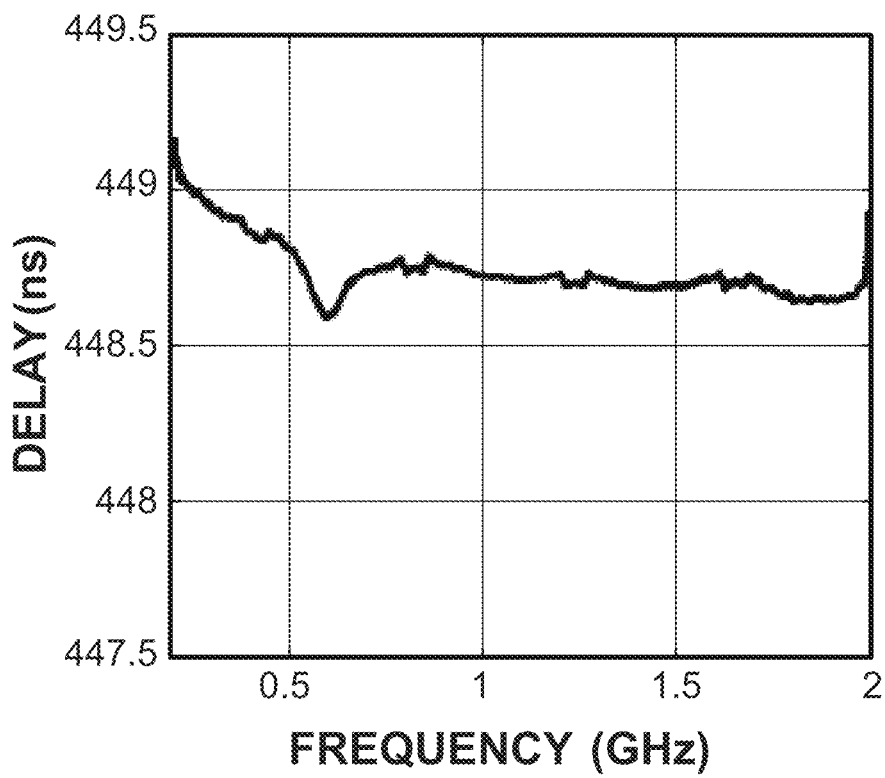
Figure 8A:
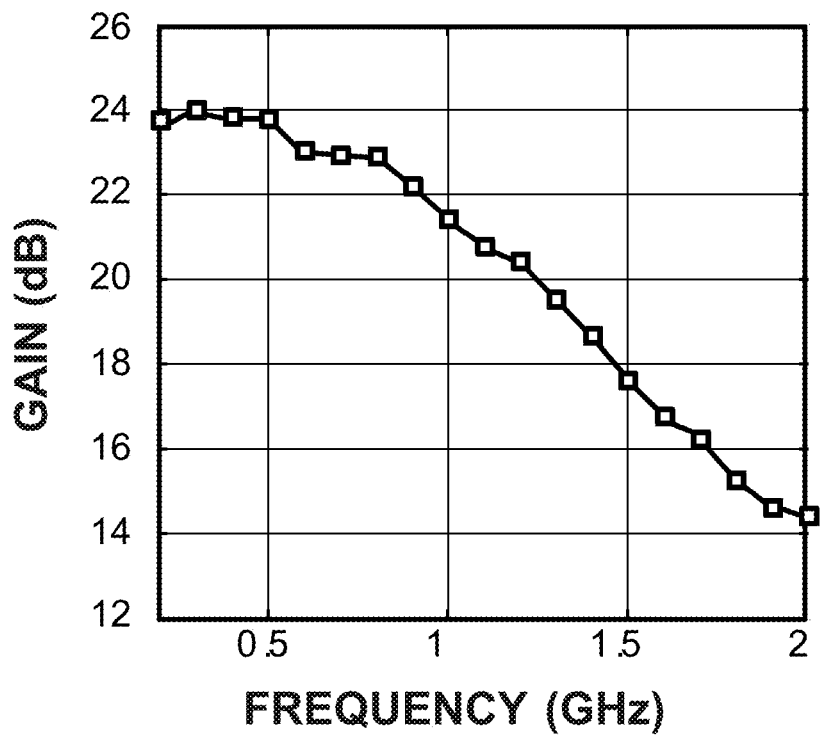
FIGS. 8A-8D illustrate the measured gain, noise figure, matching, and power consumption breakdown, respectively, for a programmable delay device in accordance with one or more embodiments of the present invention.
Figure 8B:
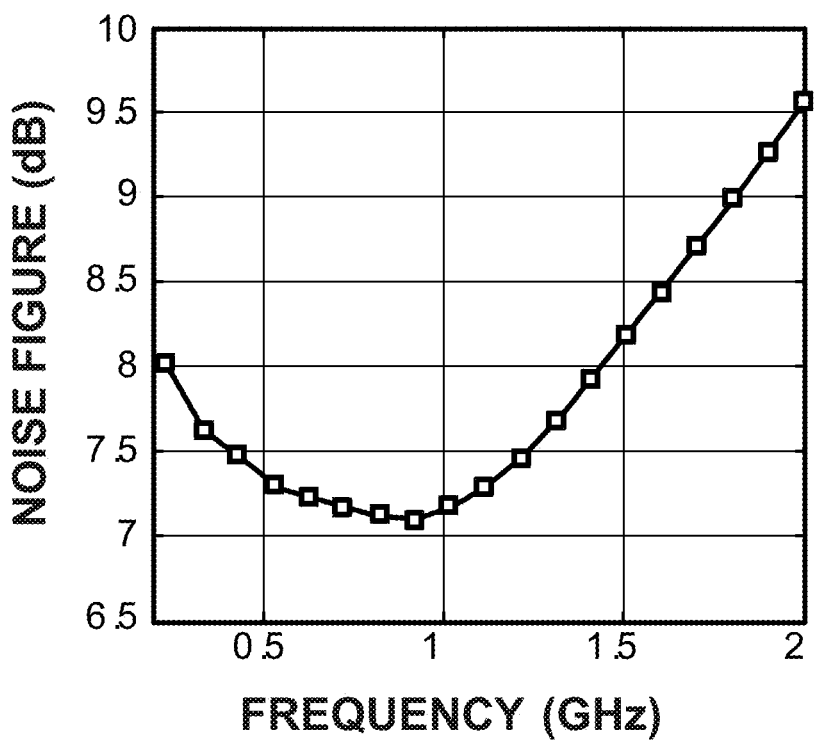
Figure 8C:
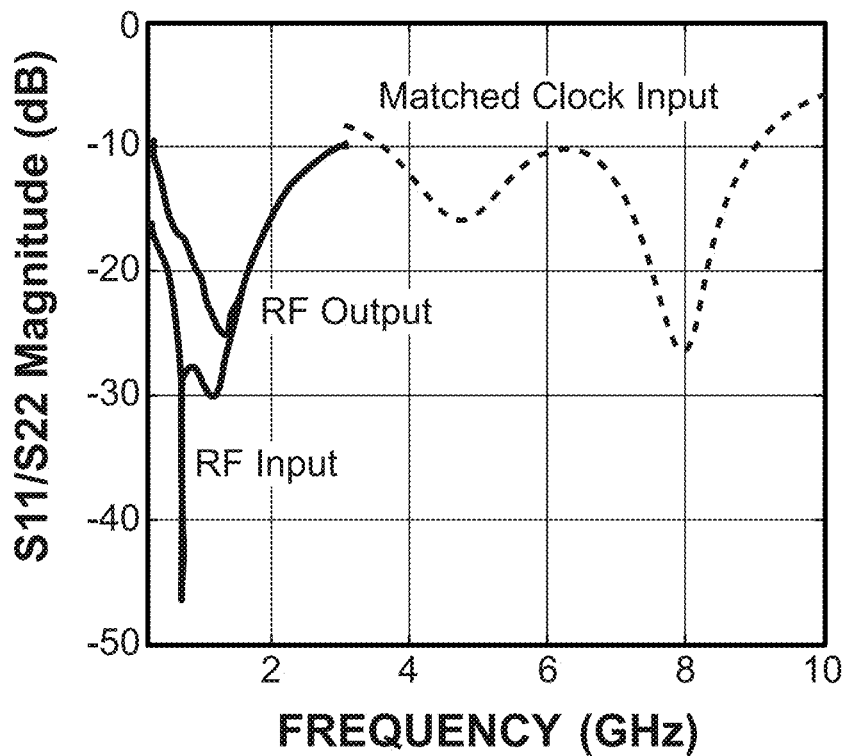
Figure 8D:
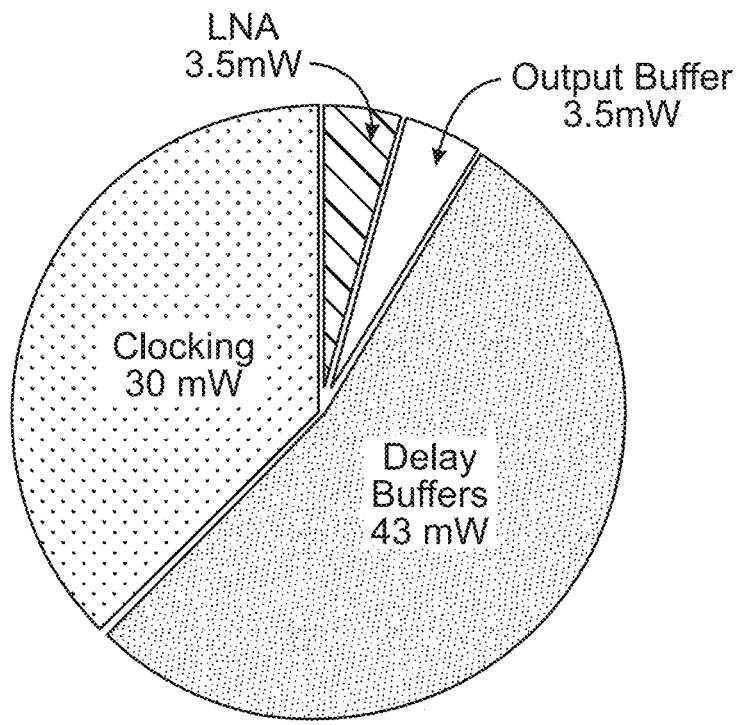

A programmable delay device in accordance with at least one embodiment was implemented in a 45 nm SOI CMOS process, resulting in a 4 mm² chip area and 1.36 mm² active area, as illustrated in the photomicrograph of FIG. 4. The programmable delay device was packaged in a 5×5 mm² quad-flat no-leads (QFN) package for testing. The sample frequency was chosen to be $F_S$=3.3 GHz ($F_{CLK}$=6.6 GHz) for full characterization. The programmable delay device was found to operate beyond $F_S$=4.4 GHz ($F_{CLK}$=8.8 GHz) and below $F_S$=3.3 GHz, providing system flexibility in clock frequency, delay range, and frequency coverage. In general, the sample frequency $F_S$ may be selected based upon the maximum desired delay ($M*(N-1)/F_S$), the desired incremental delay ($M/F_S$), and the number of delay switched capacitor storage elements N per programmable switched capacitor bank. Conversely, for a given sample frequency $F_S$, one may determine the required M and N values to achieve the desired maximum delay and desired incremental delay. Delay performance was verified across all delay settings, as illustrated in FIG. 5, using an RF input signal having a frequency $F_{RFIN}$=1 GHz. The maximum achieved delay was 448.6 ns, the minimum achieved delay was 2.55 ns, and the delay slope showed the expected 2.42 ns/step ($8/F_S$) over a 175.9× delay range. Both the measured differential nonlinearity (DNL) and integral nonlinearity (INL) of the delay was less than ±4 ps across all delay codes, as illustrated in FIG. 6. The measured delay response was relatively flat at minimum and maximum delay settings across a 0.2-to-2 GHz input frequency ($F_{RFIN}$) range, as illustrated in FIGS. 7A, 7B, respectively, with the delay variation at the maximum delay being less than 0.12%.

FIGS. 8A-8D illustrate the measured gain, noise figure (NF), matching (input S11/output S22), and power consumption breakdown, respectively, for the programmable delay device illustrated in FIG. 4. The programmable delay device achieved 24 dB of gain, a 1.1 GHz 3 dB bandwidth, and a 7.1 dB NF at its maximum delay setting. The programmable delay device achieved less than 0.1 dB difference in both gain and NF at its minimum delay setting, demonstrating successful sample leakage mitigation. Gain flatness across any 100 MHz bandwidth was better than ±0.5 dB across 0.2-to-2 GHz frequency range. As will be appreciated by one of ordinary skill in the art, the bandwidth and flatness can be further improved by increasing the sampling frequency $F_S$ to reduce the Sinc roll-off in the zero-order hold operation. The measured gain dropped by 1 dB (i.e., IP1 dB) for input RF signals having -27 dBm and -25 dBm at 1 GHz and 2 GHz, respectively, dominated by the device output buffer 320. The measured S11 (S22) magnitude for the programmable delay device input (output) were less than -10 dB over the 0.2-to-3 GHz frequency range. The measured S11 magnitude for the clock input, including an open-stub board match, was less than -10 dB over the 3.5-to-9 GHz frequency range. The programmable delay device consumed a total of 80 mW from a 1V supply, the vast majority consumed by the buffers 306, 310, 314, 316, and 318, and the clocks 332-344. The LNA 304 and the device output buffer 320 consumed comparatively little power.

Table I provides performance details comparing one embodiment of the present invention with various prior art delay devices. In Table I, ISSCC 2021 corresponds to Nagulu, ISSCC 2012 corresponds to Garakoui, JSSC 2017 corresponds to Mondal, and SSCL 2020 corresponds to M. Li et al., "An 800-ps Origami True-Time-Delay-Based CMOS Receiver Front End for 6.5-9-GHz Phased Arrays," IEEE Solid-State Circuit Letters, vol. 3, pp. 382-385 (2020), the contents of which are incorporated herein by reference. As shown in Table I, this implemented embodiment of the present invention yielded a factor of 9× improvement in area efficiency and nearly a factor of 60× increase in maximum delay relative to the best prior art.

buffers 318 created the largest spurious tones at $F_S/8$ since they repeat every 8 clock cycles. The self-biased inverter load 316 also shares the $F_S/8$ response since there are only 8 in the original programmable delay device 300. The delay buffers 314 produced negligible spurious tones since they only repeat once every 1480 clock cycles and each of the delay buffers 314 produces a random DC offset value.

To reduce DC offsets in the amplifiers, two approaches were used. Since mismatch limited DC offsets are directly reduced through increased device sizing (width times length), the length of the amplifiers in both the buffers 910 and the self-biased inverter loads 920 were increased from 40 nm to 232 nm for a DC offset reduction of ~30×. The device output buffers 318 were completely removed and replaced with an intermediate buffer 940 after the output reconstruction switches 930 where a DC blocking capacitor could be employed to remove DC offset. The device output

TABLE 1

Delay device performance comparison.

|  | Present Invention | ISSCC 2021 | ISSCC 2012 | JSSC 2017 | SSCL 2020 |
|---|---|---|---|---|---|
| Design | Delay Element | SIC Receiver | 4 Channel Beamformer | Delay Element | Delay Element + Attenuator |
| Architecture | TIMS Switched-Cap | Switched-Cap | $G_m$-C | $G_m$-C | Delay Line |
| Delay Frequency Range | 0.2-2.0 GHz | 0.1-1.0 GHz | 1.0-2.5 GHz | 0.1-2.0 GHz | 6.5-9.0 GHz |
| 3 dB Bandwidth | 0.2-1.1 GHz[a] | 0.1-0.5 GHz[b] | 1.0-2.5 GHz | 0.1-2.0 GHz | 6.5-9.0 GHz |
| Max Delay | 448.6 ns[a] | 7.75 ns[b] | 0.55 ns | 1.7 ns | 0.8 ns |
| Delay per Unit Area | 330 ns/mm²[a] | 37 ns/mm²[b] | 7.9 ns/mm² | 5.9 ns/mm² | 0.4 ns/mm² |
| Delay Range | 175.9× | 31×[b] | 39.3×[c] | 6.8× | 32×[c] |
| Gain | 24 dB | -18 dB[b] | 12 dB | 0.6 dB | 18 dB |
| Noise Figure | 7.1 dB | — | 8.0 dB | 23 dB | 3.6 dB |
| IP1dB | -27 dBm | — | -21 dBm | -13 dBm | -17 dBm |
| Power | 80 mW[a] | 7.4 mW[b] | 90 mW[d] | 364 mW | 107 mW |
| Technology | 45 nm SOI CMOS | 65 nm CMOS | 140 nm CMOS | 130 nm CMOS | 65 nm CMOS |
| Delay Active Area | 1.36 mm² | 0.21 mm²,[b] | 0.07 mm² | 0.29 mm² | 2.25 mm² |

Figure 9:
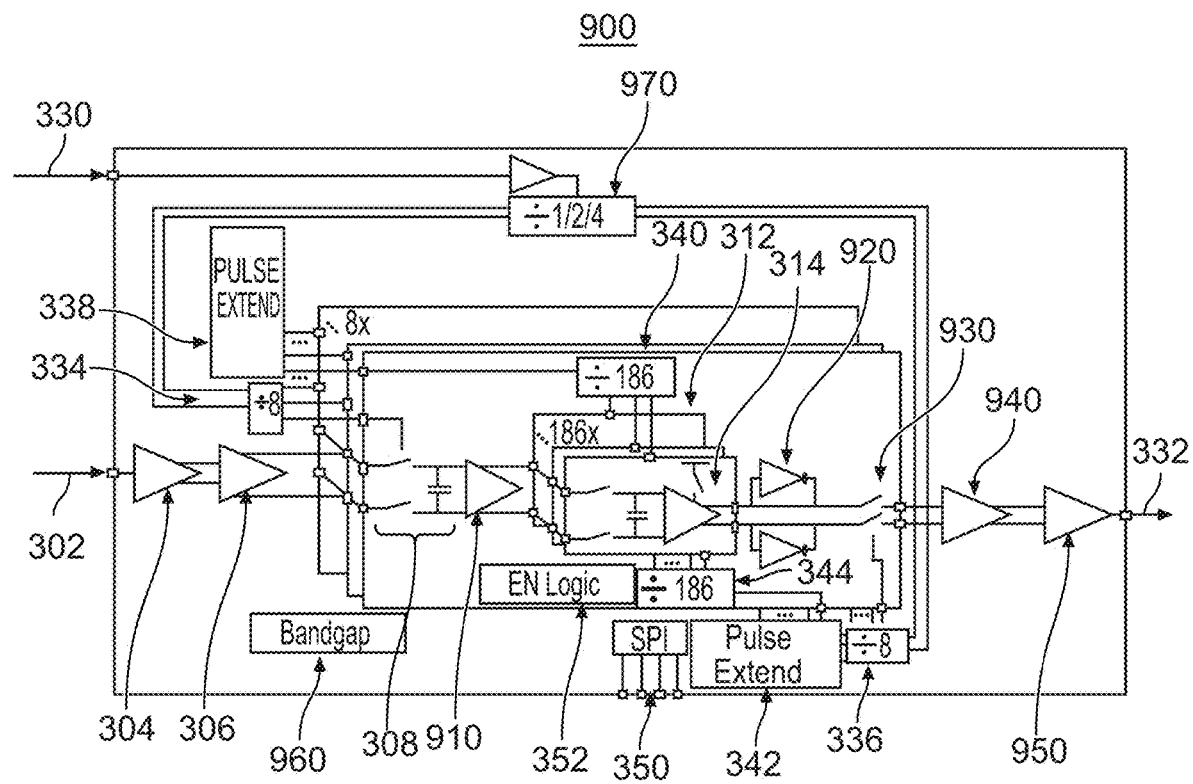
FIG. 9 illustrates a block diagram for a second differential embodiment of a programmable delay device in accordance with one or more embodiments of the present invention.

[a]Fs = 3.3 GHz,
[b]Max delay element,
[c]Based on delay step,
[d]Single channel Additional characterization of the programmable delay device 300 revealed higher than desired clock feed-through to the RF output 322 and relied on off-chip currents to properly bias the on-chip amplifiers. This led to a second programmable delay device 900 in accordance with another embodiment of the present invention. FIG. 9 illustrates this programmable delay device 900. As most of the features of the programmable delay device 900 are the same as the original programmable delay device 300, only the differences will be described.

Since complementary switches were employed in the switched-capacitor circuit switches and the chosen CMOS process has equal strength PMOS and NMOS devices, extremely small clock feed-through was found from this mechanism in the original programmable delay device 300. Simulation of DC offsets in the buffers, including buffers 310 and device output buffers 318, employed within the switched-capacitor circuits were found to produce the clock feed-through levels found in the original programmable delay device 300. Specifically, buffers 310 and device output buffers 318 could be removed since the parasitic routing capacitance from the outputs of the delay buffers 314 to the output reconstruction switches 930 was significantly higher than the input capacitance of the device output buffers 318, therefore limiting memory effects and gain reduction from the removal of the output buffers 318. The intermediate buffer 940 is followed by an output buffer 950.

The programmable delay device 900 includes an on-chip bandgap reference 960. This bandgap reference 960 provides all reference currents needed by the various RF circuits. The programmable delay device 900 includes the digital scan chain SPI interface 350, which enables programming of gain and calibration of the bandgap reference 960.

Lastly, the divide-by-2 ($F_{CLK}=2F_S$) clock 332 has been upgraded. The clock divider 970 is now a programmable divide by 1/2/4 clock divider for greater flexibility. This upgraded clock divider 970 allows operation of the programmable delay device 900 over a wider range of applications operating at a wider range of clock frequencies $F_{CLK}$.

Characterization of the programmable delay device 900 showed several improvements over the original programmable delay device 300. $F_{CLK}$ was verified to properly operate from 2 GHz to 13 GHz with a minimum required input power of less than −10 dBm. The supported ranges, combined with the on-chip programmable clock divider 970, provide system flexibility in clock frequency, delay range, and frequency coverage. At $F_S$=3.3 GHz and $F_{CLK}$=6.6 GHz, the device consumes 74 mW (3.5 mW LNA 304, 3.5 mW output buffer 950, 29 mW clocking, 38 mW delay buffers 304) from a 1V core supply and less than 250 µW from a 1.8V supply used for digital I/O and the bandgap reference 960.

Figure 10A:
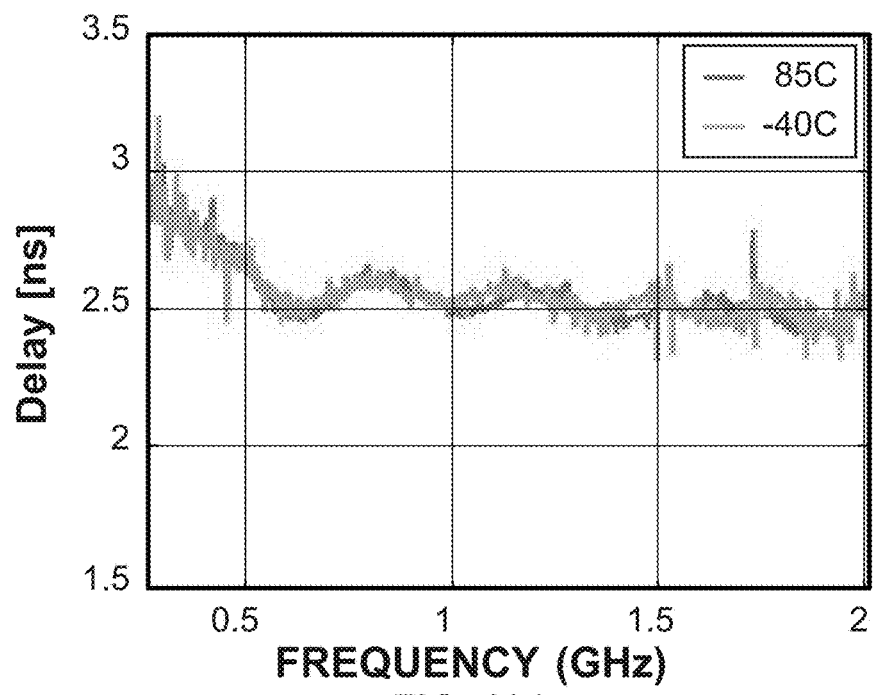
FIGS. 10A and 10B illustrate the measured delay response at minimum and maximum delay settings, respectively, at both −40° C. and 85° C., across a 0.2-to-2 GHz input frequency range for a programmable delay device in accordance with one or more embodiments of the present invention.
Figure 10B:
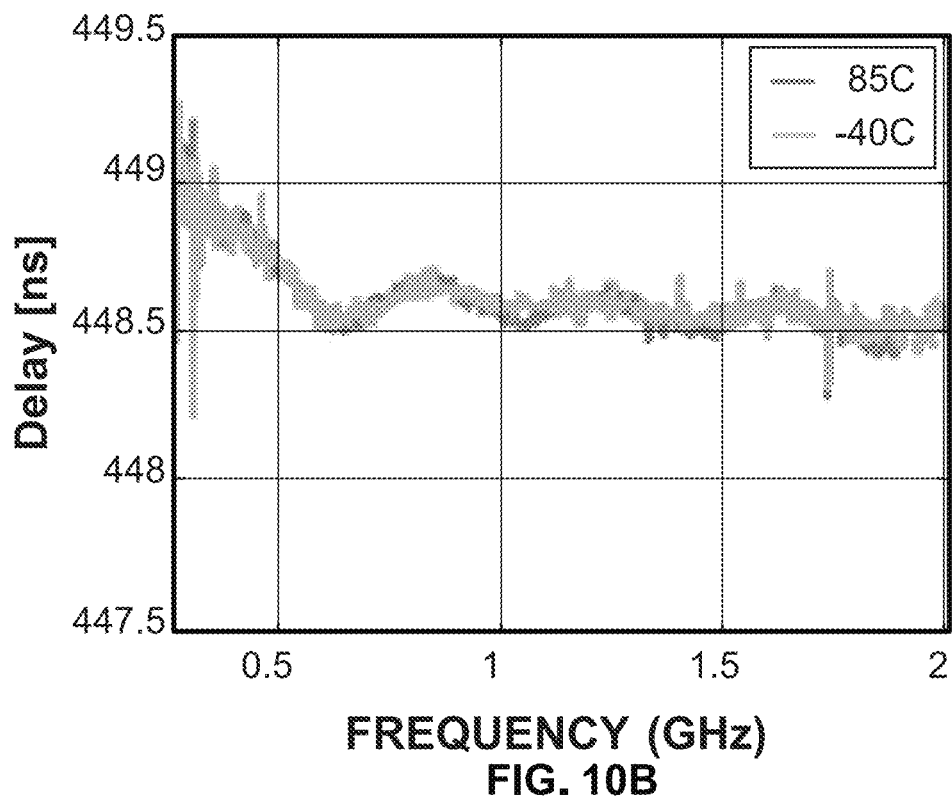

Delay measurements were repeated inside a temperature chamber over a temperature range of −40° C. to 85° C. as shown in FIG. 10A at the minimum delay over an RF input frequency range of 0.2-2 GHz. FIG. 10B illustrates the same test with the maximum delay. Delay performance was found to be maintained across the 125° C. temperature range, showing the robustness of the proposed delay approach.

Figure 11A:
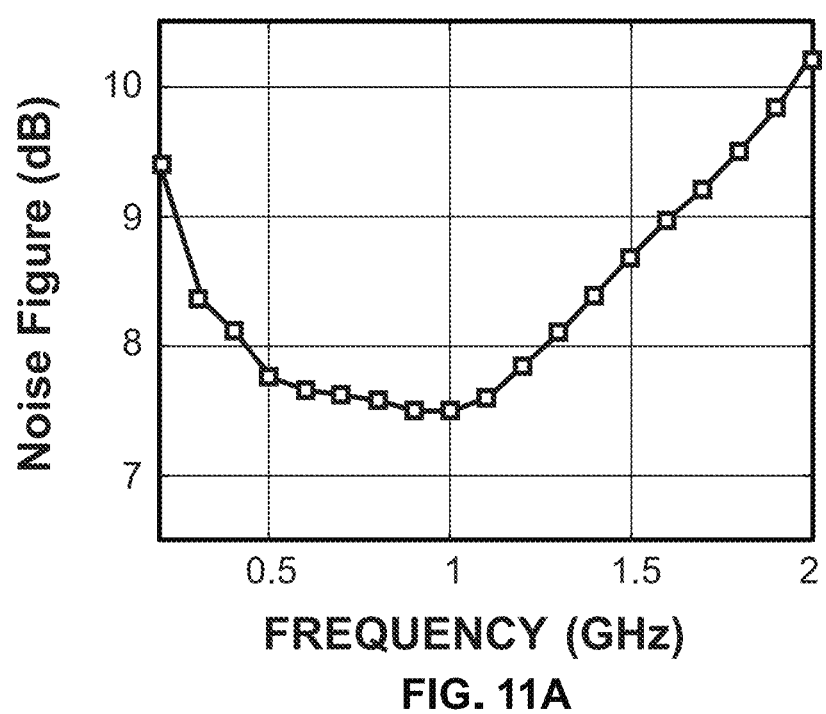
FIGS. 11A and 11B illustrate the measured gain and noise figure between −40° C. and 85° C., respectively, for a programmable delay device in accordance with one or more embodiments of the present invention.
Figure 11B:
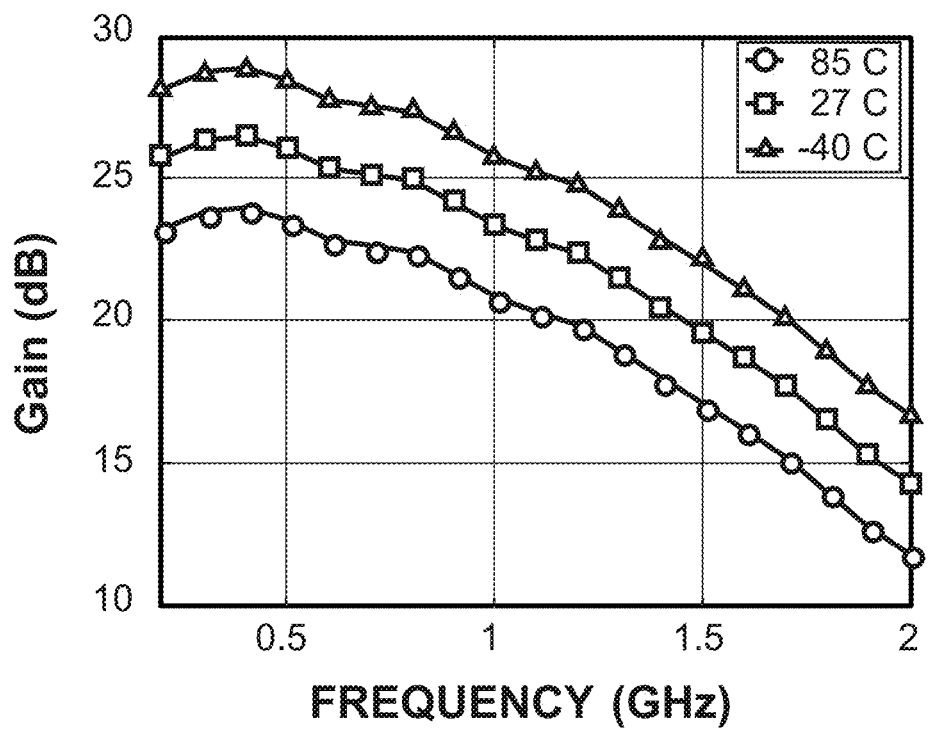

The noise figure was measured at room temperature and gain was verified over a temperature range of −40° C. to 85° C. during the delay measurements as illustrated in FIGS. 11A and 11B, respectively. The programmable delay device 900 achieved a minimum noise figure of 7.4 dB which increases below 400 MHz due to flicker noise and above 1.1 GHz as device gain reduces. The gain is a maximum of 26 dB at room temperature and varies by ±2.4 dB over the full temperature range. The programmable delay device 900 achieved a 3-dB bandwidth of 1.1 GHz and less than 0.25 dB gain variation was observed between the maximum and minimum delay settings showing successful sample leakage mitigation. Gain flatness across any 100 MHz bandwidth was less than ±0.5 dB across 0.2-2 GHz. Bandwidth and flatness can be further improved by operating at $F_S$ greater than 3.3 GHz to reduce the Sinc roll-off inherent to the zero-order hold operation as described above. Input-referred P1 dB was −29 dBm at 300 MHz and −27 dBm at 1 GHz, dominated by the output buffer 950. S11/S22 was measured to be less than −10 dB across 0.2-3 GHz for the RF input/output, and from 1-9 GHz for $F_{CLK}$.

Figure 12A:
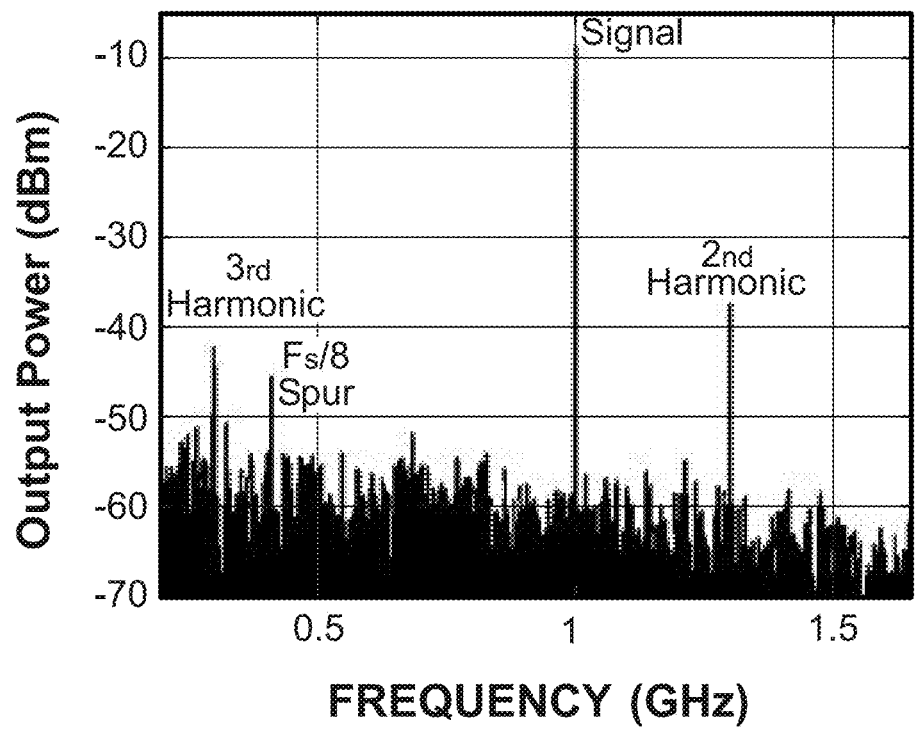
FIGS. 12A and 12B illustrate the measured output spectrum up to $F_S/2$ given an input tone at 1 GHz with signal levels −30 dBm and −37 dBm, respectively, for a programmable delay device in accordance with one or more embodiments of the present invention.
Figure 12B:
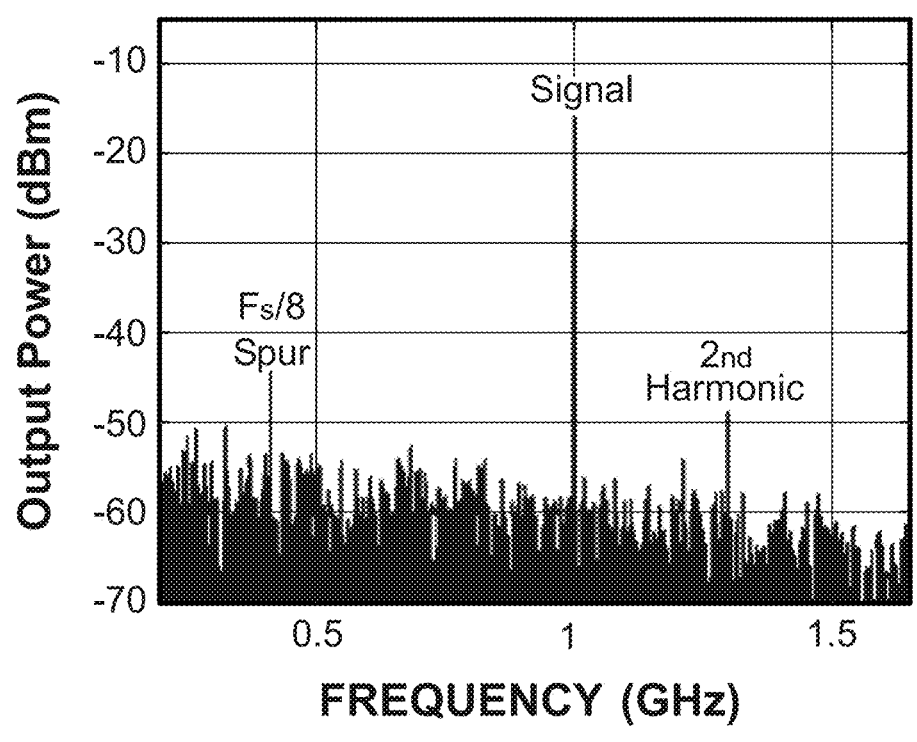

FIGS. 12A and 12B illustrate the measured device output spectrum up to $F_S$/2 given an input tone at 1 GHz with RF input signal levels of −30 dBm (3 dB below P1 dB) and −37 dBm (10 dB below P1 dB). The dominant clock spur is located at $F_S$/8 at an output level of −45 dBm (input-referred −71 dBm) and broadband clock spurs are less than −53 dBm (input-referred less than −78 dBm) across the spectrum. This represents a 24 dB improvement in spurious performance at $F_S$/8 compared to the original programmable delay device 300, showing successful implementation of DC offset mitigation approaches employed in the programmable delay device 900. Clock spurious limited spurious-free dynamic range (SFDR) is found to be a maximum of 44 dB, while overall SFDR including signal distortion is a maximum of 32 dB at an RF input signal level of −34 dBm at 1 GHz. SFDR performance was measured to be constant across a temperature range of −40° C. to 85° C.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A programmable delay device comprising:
   an input sampling stage including M sampling switched capacitor storage elements, the M sampling switched capacitor storage elements adapted to sequentially sample and hold a corresponding portion of an input RF signal, the thus sampled and held portions of the input RF signal being input sampled signals;
   a programmable delay stage including:
      M programmable switched capacitor banks, each programmable switched capacitor bank including N delay switched capacitor storage elements, each delay switched capacitor storage element adapted to sample and hold a corresponding time interleaved portion of a corresponding input sampled signal, the thus sampled and held signals being delay sampled switched signals, each delay switch capacitor storage element coupled to a corresponding delay output switch; and
      an enable timing circuit adapted to receive a desired delay value, the enable timing circuit including a digital counter, the digital counter adapted to count to the desired delay value, upon reaching the desired delay value the enable timing circuit is adapted to enable a corresponding delay output switch; and
   an output reconstruction stage including M output reconstruction switches, each output reconstruction switch coupled to a corresponding delay output switch, each output reconstruction switch adapted to output a corresponding time interleaved delay sampled switched signal, the thus output signals being output reconstruction signals, the output reconstruction stage adapted to output the output reconstruction signals in a sequential manner thereby generating a reconstructed output RF signal.

2. The programmable delay device of claim 1, wherein M is equal to or greater than 4.

3. The programmable delay device of claim 1, wherein each sampling switched capacitor storage element includes:
   an input sampling capacitor adapted to hold a corresponding input sampled signal; and
   an input sampling switch adapted to sequentially couple the input RF signal to the input sampling capacitor.

4. The programmable delay device of claim 1, wherein N is equal to or greater than 2.

5. The programmable delay device of claim 1, wherein each delay switched capacitor storage element includes:
   a switched bank sampling capacitor adapted to hold a corresponding delay sampled switched signal; and
   an input switched bank switch adapted to couple a corresponding input sampled signal to the switched bank sampling capacitor in a time interleaved manner.

6. The programmable delay device of claim 1, wherein the input sampling stage further includes M buffers, each buffer coupling a corresponding sampling switched capacitor storage element to a corresponding programmable switched capacitor bank.

7. The programmable delay device of claim 1, wherein the programmable delay stage further includes M×N delay buffers, each delay buffer coupling a corresponding delay switched capacitor storage element to a corresponding delay output switch.

8. The programmable delay device of claim 1, wherein the output reconstruction stage further includes M output buffers, each output buffer coupling a corresponding delay output switch to a corresponding output reconstruction switch.

9. The programmable delay device of claim 1 further comprising:
an input divide-by-M clock adapted to receive a sampling clock signal, to divide the sampling clock signal by M, and to output M thus generated input divide-by-M clock signals; and
M input divide-by-N clocks, each input divide-by-N clock adapted to receive a corresponding input divide-by-M clock signal, to divide the corresponding input divide-by-M clock signal by N, and to output N thus generated input divide-by-N clock signals;
wherein each sampling switched capacitor storage element is adapted to be operated by a corresponding input divide-by-M clock signal; and
wherein each delay switched capacitor storage element is adapted to be operated by a corresponding input divide-by-N clock signal.

10. The programmable delay device of claim 9 further comprising a divide-by-P clock adapted to receive the sampling clock signal, to divide the sampling clock signal by P, and to output a thus generated divide-by-P clock signal to the input divide-by-M clock as the sampling clock signal.

11. The programmable delay device of claim 9 further comprising an input pulse extend clock adapted to receive the M input divide-by-M clock signals, to lengthen a pulse length of each input divide-by-M clock signal, and to output M thus generated input pulse extended clock signals to the M input divide-by-N clocks as corresponding input divide-by-M clock signals.

12. The programmable delay device of claim 9 further comprising:
M output divide-by-N clocks, each output divide-by-N clock adapted to receive a corresponding input divide-by-M clock signal, to divide the corresponding input divide-by-M clock signal by N, and to output N thus generated output divide-by-N clock signals;
wherein each output reconstruction switch is adapted to be operated by a corresponding input divide-by-M clock signal; and
wherein each delay output switch is adapted to be operated by a corresponding output divide-by-N clock signal.

13. The programmable delay device of claim 9 further comprising:
an output divide-by-M clock adapted to receive the sampling clock signal, to divide the sampling clock signal by M, and to output M thus generated output divide-by-M clock signals;
M output divide-by-N clocks, each output divide-by-N clock adapted to receive a corresponding output pulse extended clock signal, to divide the corresponding output pulse extended clock signal by N, and to output N thus generated output divide-by-N clock signals;
wherein each output reconstruction switch is adapted to be operated by a corresponding output divide-by-M clock signal; and
wherein each delay output switch is adapted to be operated by a corresponding output divide-by-N clock signal.

14. The programmable delay device of claim 13 further comprising an output pulse extend clock adapted to receive the M output divide-by-M clock signals, to lengthen a pulse length of each output divide-by-M clock signal, and to output M thus generated output pulse extended clock signals to the M output divide-by-N clocks as corresponding output divide-by-M clock signals.

15. The programmable delay device of claim 1 further comprising a serial programming interface adapted to receive the desired delay value from an external programming source and to output the desired delay value to the digital counter.

16. The programmable delay device of claim 1, wherein at least a portion of the programmable delay device is implemented with CMOS circuitry.

17. The programmable delay device of claim 1, wherein at least a portion of the programmable delay device is implemented in either a single-ended configuration or a differential configuration.

18. The programmable delay device of claim 1, wherein the programmable delay device has an area efficiency of greater than 100 ns/mm$^2$.

19. The programmable delay device of claim 1, wherein the programmable delay device has a maximum delay of greater than 100 ns.

20. The programmable delay device of claim 1, wherein the programmable delay device has a 3 dB bandwidth of greater than 500 MHz.

* * * * *